(12) United States Patent
Sarkar et al.

(10) Patent No.: US 7,618,873 B2
(45) Date of Patent: Nov. 17, 2009

(54) MOS VARACTORS WITH LARGE TUNING RANGE

(75) Inventors: Manju Sarkar, Singapore (SG); Purakh Raj Verma, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 150 days.

(21) Appl. No.: 11/696,736

(22) Filed: Apr. 5, 2007

(65) Prior Publication Data

US 2008/0246071 A1 Oct. 9, 2008

(51) Int. Cl.
*H01L 21/20* (2006.01)
*H01L 21/425* (2006.01)

(52) U.S. Cl. .................. 438/379; 438/514; 438/526

(58) Field of Classification Search .............. 438/238, 438/379, 514, 526; 257/E21.364, E27.049, 257/E29.344
See application file for complete search history.

(56) References Cited

U.S. PATENT DOCUMENTS

| | | | |
|---|---|---|---|
| 5,500,387 A | 3/1996 | Tung et al. | |
| 5,525,533 A | 6/1996 | Woodruff et al. | |
| 5,608,258 A | 3/1997 | Rajkanan et al. | |
| 5,998,255 A | 12/1999 | Kung et al. | |
| 6,222,221 B1 | 4/2001 | Hou et al. | |
| 6,489,196 B1 | 12/2002 | Lin et al. | |
| 6,949,440 B2 * | 9/2005 | Gau | 438/379 |
| 7,022,566 B2 * | 4/2006 | Wong et al. | 438/228 |
| 2001/0011760 A1 | 8/2001 | Kim | |

OTHER PUBLICATIONS

Herbert S. Bennett et al., Device Technology Evolution for Si-Based RF Integrated Circuits, IEEE Transactions on Electron Devices, vol. 52, No. 7, Jul. 2005, pp. 1235-1258.

* cited by examiner

*Primary Examiner*—Hung Vu
(74) *Attorney, Agent, or Firm*—Horizon IP Pte Ltd

(57) ABSTRACT

A MOS varactor includes a shallow PN junction beneath the surface of the substrate of a MOS structure. In depletion mode, the depletion region of the MOS structure merges with the depletion region of the shallow PN junction. This increases the total width of the depletion region of the MOS varactor to reduce $C_{min}$.

21 Claims, 13 Drawing Sheets

100

MOS VARACTORS WITH LARGE TUNING RANGE

FIELD OF THE INVENTION

The present invention relates generally to integrated circuits, with larger tuning range and higher quality factor.

BACKGROUND OF THE INVENTION

In integrated circuits (ICs), various components such as transistors, resistors, inductors, capacitors and varactors are configured to achieve the desired function. Varactors are essentially capacitors where the capacitance value varies with the voltage applied. One common type of varactors is metal oxide semiconductor (MOS) varactors. MOS varactors are generally employed for complementary MOS (CMOS) applications.

FIG. 1 shows a conventional n-type accumulation mode MOS varactor 100. The n-type MOS varactor is formed on an n-well 114 of a p-type silicon substrate 105. The varactor includes a gate structure 140 disposed on a surface 106 of the substrate. The gate structure includes a heavily n-doped ($n^+$) polysilicon layer 142 over a dielectric layer such as an oxide layer 144. Contacts to the n-well are provided by $n^+$ doped regions 148a-b. Typically spacers (not shown) are provided on the sides of the gate structure.

The capacitance of the varactor can be changed or tuned by varying an input voltage. The input voltage can be varied or swept between $-V_{dd}$ to $V_{dd}$. This input voltage can be applied either to the polysilicon gate or to the n-well. When the voltage on the polysilicon gate is positive with respect to the n-well, negatively charged carriers accumulate in the substrate region under the gate. This causes the capacitance of the varactor to be at the maximum capacitance ($C_{max}$). As the positive voltage on the polysilicon gate decreases and become negative with respect to n-well, negatively charged carriers in the substrate region under the gate migrate away, forming a depletion region, as indicated by dotted line 126. As width of the depletion region increases, the capacitance of the varactor progressively decreases. The depletion region reaches its maximum width when the gate is at the most negative voltage with respect to the n-well, which corresponds to the minimum capacitance ($C_{min}$) of the varactor.

An important factor is the tuning range of the varactor, which corresponds to the capacitance range in which the varactor operates and is defined by ratio $C_{max}/C_{min}$. Generally, it is desirable for a varactor to have a large tuning range to provide better functionality of the circuit. Furthermore, particularly with mobile products, a high quality factor is desirable since this correlates to low power consumption.

From the foregoing discussion, it is desirable to provide a MOS varactor with a larger tuning range and a higher quality factor.

SUMMARY OF THE INVENTION

The present invention relates to MOS varactors. In one aspect of the invention, a MOS varactor comprises of a MOS transistor formed on a varactor region of a substrate. A first well is located in the varactor region, wherein the first well comprises of a first polarity type. A second buried well is located in the varactor region, wherein the second buried well comprises of a second polarity type. The first well and the top of the second buried well forms a shallow PN junction below a top surface of the substrate. In the depletion mode of operation, the depletion region under the gate merges with the depletion region of the shallow PN junction. This creates a depletion width wider than the conventional one, thereby further reducing $C_{min}$.

In another aspect of the invention, a method for forming a MOS varactor is provided. The process comprises of providing a substrate prepared with a first well in a varactor region. A second buried well is formed in the varactor region. The second buried well and the first well forms a shallow PN junction in the varactor region. In depletion mode, a depletion region under the gate merges with the depletion region of the shallow PN junction.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE INVENTION

The present invention relates to MOS varactors. The MOS varactors can be incorporated into ICs. In particular, the MOS varactors can be easily incorporated into ICs using standard CMOS processing technologies. The ICs can be any type of IC, for example dynamic or static random access memories, signal processors, or system on chip devices, mixed signal or analog devices such as A/D converters and switched capacitor filters. Other types of ICs are also useful. Such ICs are incorporated in, for example, communication systems and various types of consumer products.

Figure 1:
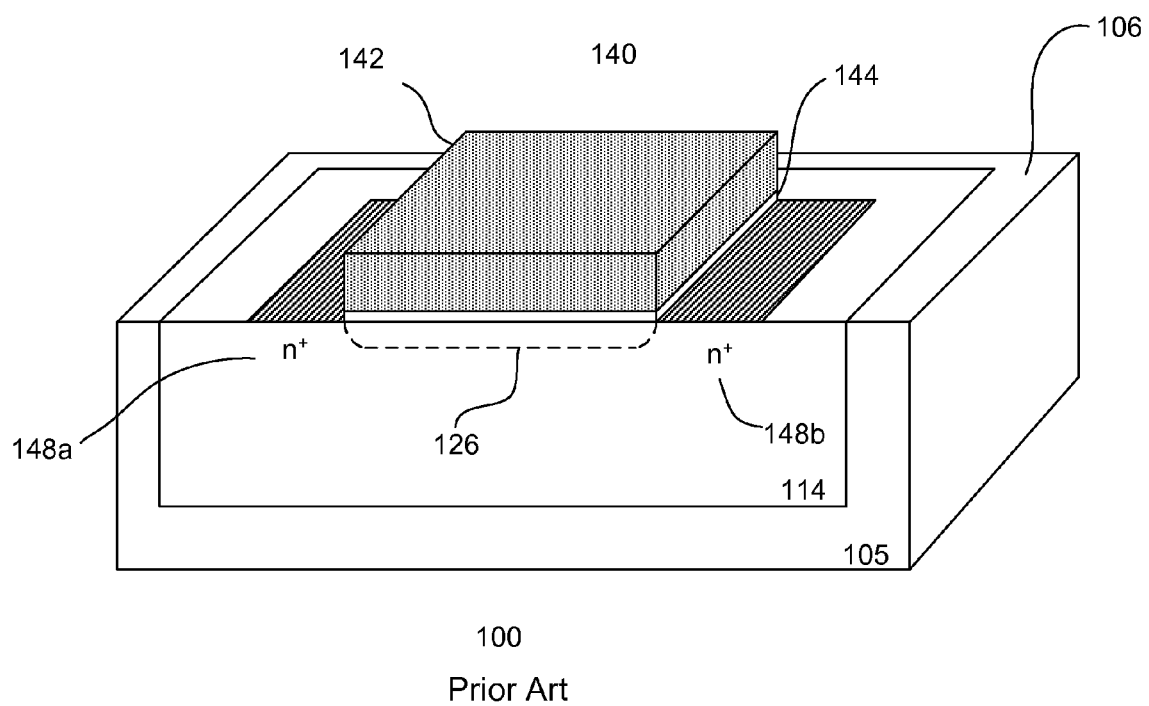
FIG. 1 shows a conventional MOS varactor.
Figure 2:
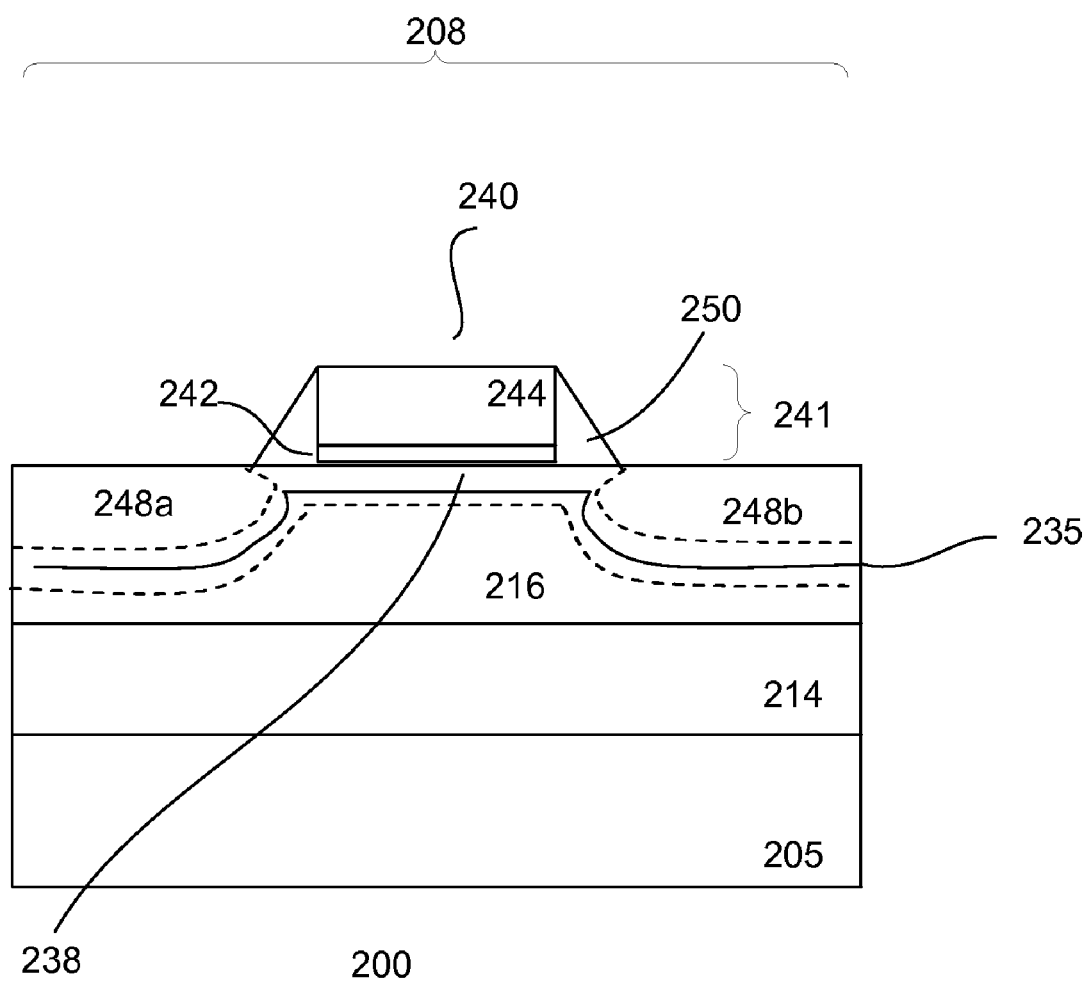
FIG. 2 shows a MOS varactor in accordance with one embodiment of the invention.

FIG. 2 shows a varactor 200 in accordance with one embodiment of the invention. The varactor includes a MOS structure 240 formed on a substrate 205. In one embodiment, the structure forms an n-type accumulation mode varactor. Typically, the substrate comprises of a lightly doped p-type silicon substrate. Other types of substrates are also useful. The MOS varactor region 208 is defined on the substrate. Isolation regions (not shown), which for example comprise of shallow trench isolation regions, are provided to isolate the varactor region from other device regions. Within the varactor region is a first well 214 of a first-type (n-type). A second well 216 of a second-type (p-type) is located in the first well. In one embodiment, the second well comprises of a buried built-in well located below the surface of the substrate, forming a shallow PN junction 235. A channel region 238 of the first-type is located between the shallow PN junction and the substrate surface. Thus an NPN structure is formed. For applications using a lightly doped p-type substrate, an NPNP structure is formed. If the p-well implants are able to fully compensate the lower part of the n-well, the MOS structure is formed of only an NP junction near the surface.

The MOS transistor comprises of a gate stack 241 formed on the substrate surface. The gate stack includes, for example, a gate dielectric 242 and gate electrode 244. Typically, the gate dielectric comprises of oxide and the gate electrode comprises of polysilicon. Other types of materials can also be used for the gate stack. On the sides of the gate stack are dielectric spacers 250. The spacers, for example, comprise of oxide and/or nitride. Located adjacent to the gates beneath the substrate surface are first and second contact regions 248a-b. The contact regions, in one embodiment, comprise of heavily doped first-type (n$^+$) regions. The contact regions are electrically coupled to the channel region between the substrate surface and the shallow PN junction. In one embodiment, the n$^+$ regions have a depth between the shallow junction and the bottom of the second buried well. Providing n$^+$ regions having other depth, such as shallower than the shallow PN junction, is also useful. Additional well contacts (not shown) as needed are also useful.

In one embodiment, the varactor comprises an input terminal coupled to the gate electrode of the MOS varactor. Alternatively, the input terminal can be coupled to the contact regions of the MOS varactor. An input voltage is applied to the input terminal. The input voltage can be varied within an operational range, placing the varactor from accumulation to depletion mode. In one embodiment, the operational range of the input voltage is from $-V_{dd}$ to $+V_{dd}$. Providing other input voltage ranges may also be useful, for example, greater than $|V_{dd}|$. A reverse bias voltage $V_r$ may be applied to the p-region, to further increase the depletion width of the shallow junction and thereby further lower $C_{min}$.

In the accumulation mode (e.g., $V_{in}=V_{dd}$ applied at the gate), negatively charged carriers accumulate under the gate structure (channel region). The capacitance of the varactor operating in the accumulation mode is determined by the thickness of the gate dielectric layer and its dielectric constant value. This corresponds to the maximum capacitance ($C_{max}$) of the varactor, which is the same as that of the conventional designs. As the varactor shifts from the accumulation mode to the depletion mode by adjusting $V_{in}$ (e.g., $V_{in}=<V_{dd}$ to $-V_{dd}$), charge carriers migrate away from the channel region and a depletion region starts to form. The depletion region formed in the channel region decreases the capacitance of the varactor. The capacitance decreases as the width of the depletion region increases. When the width of the depletion region reaches its widest, the capacitance of the varactor is at its minimum ($C_{min}$).

In accordance with one embodiment of the invention, in the depletion mode, the depletion region under the channel merges with the depletion region formed around the shallow PN junction. Merging of the depletion regions effectively increases the width of the channel depletion region which results in a further decrease in the minimum capacitance $C_{min}$ of the varactor, as compared to that of a conventional design.

In another embodiment, the varactor comprises of a p-MOS accumulation mode varactor. For p-MOS accumulation mode varactor, the first-type well comprises of p-type dopants and the second-type well comprises of n-type dopants. Like the n-MOS varactor, the operational range of the p-MOS varactor is from $-V_{dd}$ to $+V_{dd}$ by biasing the gate or the top p-channel, or both. The top p-channel is coupled to $V_s$. The buried n-well (second well) can be coupled to $V_r$, for a reverse bias. The input voltage applied at the gate can sweep from $V_{dd}$ for depletion mode to $-V_{dd}$ for accumulation mode.

Figure 3A:
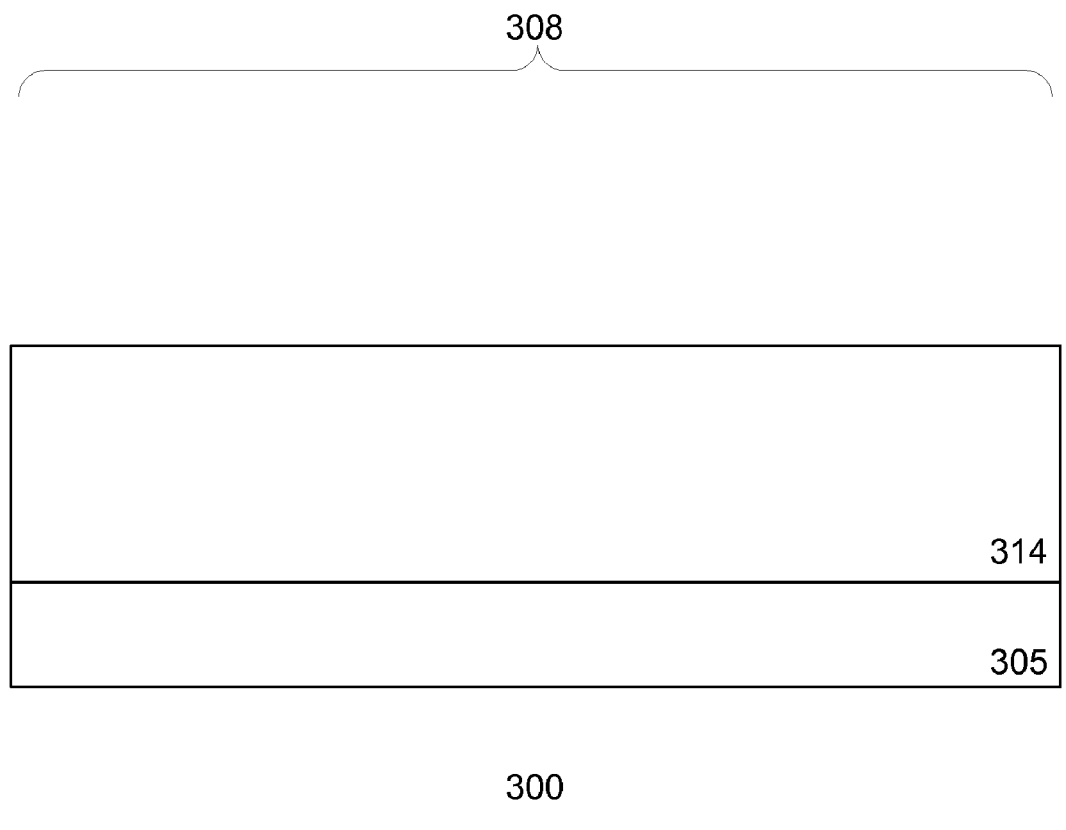
FIGS. 3a-e show a process for forming a MOS varactor in accordance with one embodiment of the invention.

FIGS. 3a-e show a process for forming a varactor 300 in accordance with one embodiment of the invention. As shown, the process forms an n-type accumulation mode MOS varactor. Referring to FIG. 3a, a semiconductor substrate 305, such as a p-type silicon substrate is provided. Other types of substrates, such as SOI, epitaxial silicon layers, may also be used. The substrate is prepared with a first well 314 with a first polarity type. In one embodiment, the first well comprises of an n-type well (n-well). The n-well defines a varactor region 308 in the substrate.

Figure 3B:
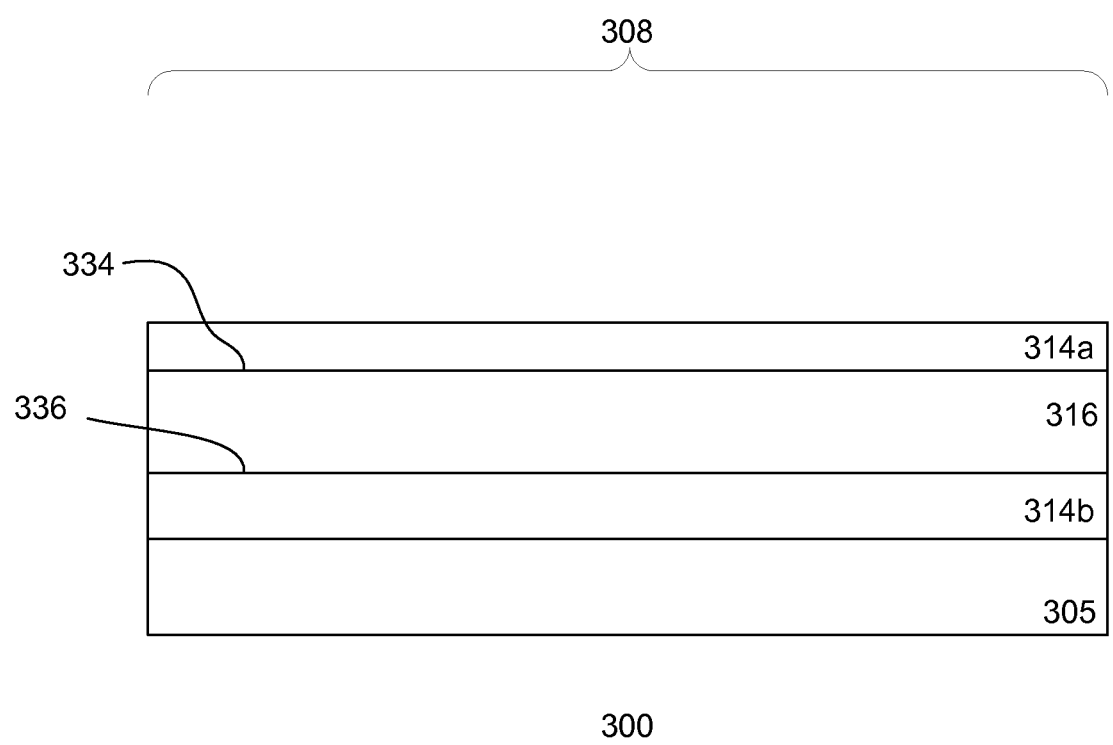

The process continues by forming a second well 316 having a second polarity type, as shown in FIG. 3b. The second well comprises a p-type well (p-well). In one embodiment, the p-well comprises of a buried p-well, formed beneath the surface of the substrate. The buried p-well is located between first and second portions 314a-b of the first n-well. The first portion and the top of the second well form a shallow PN junction 334 and the second portion and the bottom of the second well form a second PN junction 336. In accordance with one embodiment of the invention, the depth of the shallow PN junction is positioned such that the depletion region around the PN junction merges with the depletion region of the varactor in depletion mode. This results in a wider depletion region which reduces $C_{min}$ of the varactor.

To form the wells, conventional ion implantation techniques, such as implantation with a mask can be used. In one embodiment, separate ion implantation processes are used for different wells. Suitably tailored well implants of a CMOS process can be shared to form the wells. Preferably, the wells can be formed without the use of additional masks. For example, the p-well of the varactor can be formed when p-wells for CMOS devices are formed using the same implant mask. Alternatively, the wells for the varactors are formed separately from wells of the CMOS devices, using additional masks. This allows wells to be optimized for the varactors.

Isolation regions (not shown) are formed to isolate the varactor region from other device regions. The isolation regions, for example, comprise of shallow trench isolation (STI) regions. The STI regions can be formed using various conventional processes. For example, the substrate can be etched using conventional etch and mask techniques to form trenches which are then filled with dielectric material such as silicon oxide. Chemical mechanical polishing (CMP) can be performed to remove excess oxide and provide a planar substrate top surface. The STI regions can be formed, for example, prior to or after the formation of the doped wells.

Figure 3C:
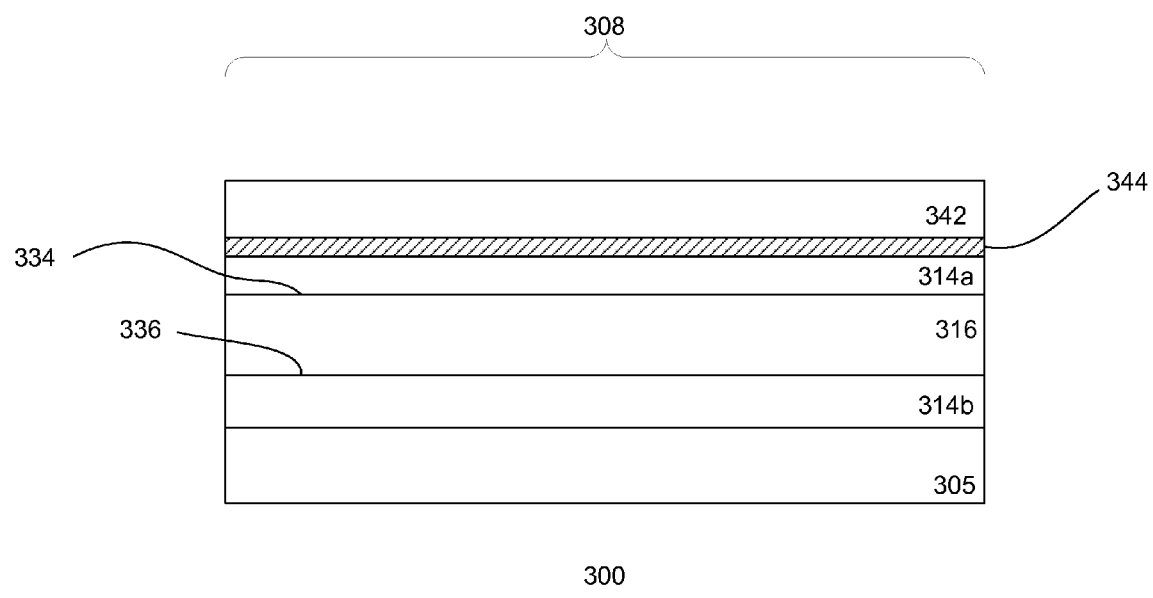

Referring to FIG. 3c, the process continues to form the gate layers on the substrate. For example, forming the gate layers comprises of sequentially forming a gate dielectric layer 344 and a gate electrode layer 342 on the substrate surface. In one embodiment, the gate dielectric layer comprises of thermal oxide. Other types of gate dielectrics are also useful. The gate electrode layer, for example, comprises of polysilicon. In one embodiment, the gate layer comprises of a heavily doped polysilicon layer of the first polarity type (e.g., n-type). The polysilicon can be in-situ doped or doped by ion implantation after deposition.

Figure 3D:
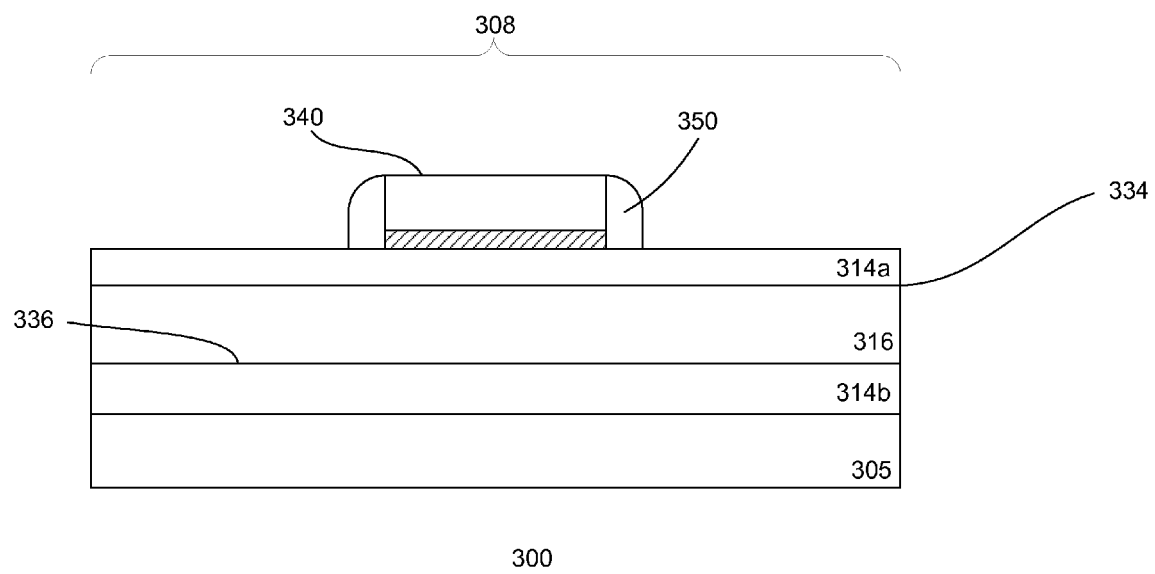

As shown in FIG. 3d, the layers are then patterned using conventional mask and etch techniques to form a gate structure 340. Typically, sidewall spacers 350 are formed on the gate structure. The sidewall spacers 350 comprise of a dielectric material such as oxide and/or nitride. The spacers can be formed using conventional spacer processes, such as depositing a blanket oxide layer on the substrate and gate structure. The oxide layer is then patterned to remove the horizontal portions, leaving the spacers on sidewalls of the gate structure.

Figure 3E:
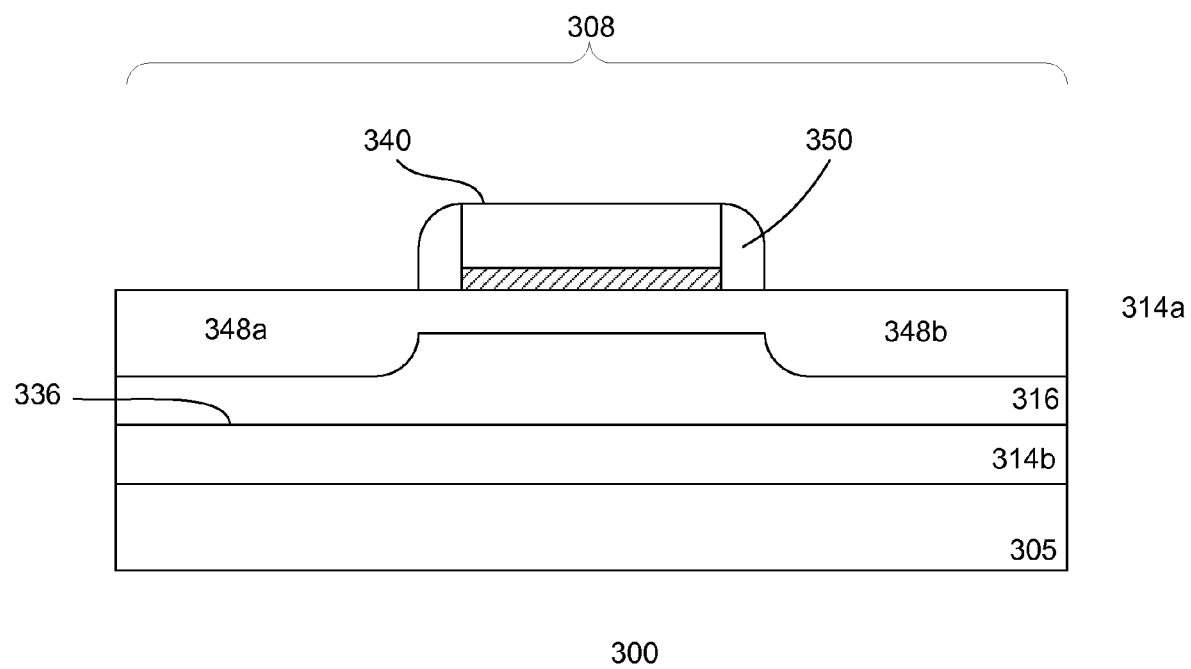

Referring to FIG. 3e, contact regions 348a-b are formed. The contact regions, for example, comprise of heavily doped regions of the first polarity type. The first polarity type comprises of n-type dopants. The contact regions are formed on the surface of the substrate adjacent to the gate structure. In one embodiment, contact regions comprise of a depth which is deeper than the shallow PN junction. Other depth, such as shallower than the shallow PN junction, are also useful. As shown, the junction is located between the shallow and second PN junctions. The doped regions can be formed by ion implantation. The implant can be self-aligned and formed using an implant mask. Other techniques for forming the contact regions are also useful.

The process continues by forming interconnections to the contacts of the varactor to provide input and bias voltages. For example, a dielectric is deposited and patterned to create vias and trenches, which are then filled with conductive material, such as copper, to form interconnects. Additional processes are performed to complete the IC, for example, additional interconnect levels, final passivation, dicing, and packaging.

The process as described produces an n-type MOS varactor. A p-type MOS varactor can also be produced by, for example, providing a first-type as p-type and a second-type as n-type. The varactor of the present invention can be easily integrated into conventional CMOS processes. Existing implant masks can be used to execute any additional ion implant steps required. This eliminates the need for additional masks, which reduces cost.

Figure 4A:
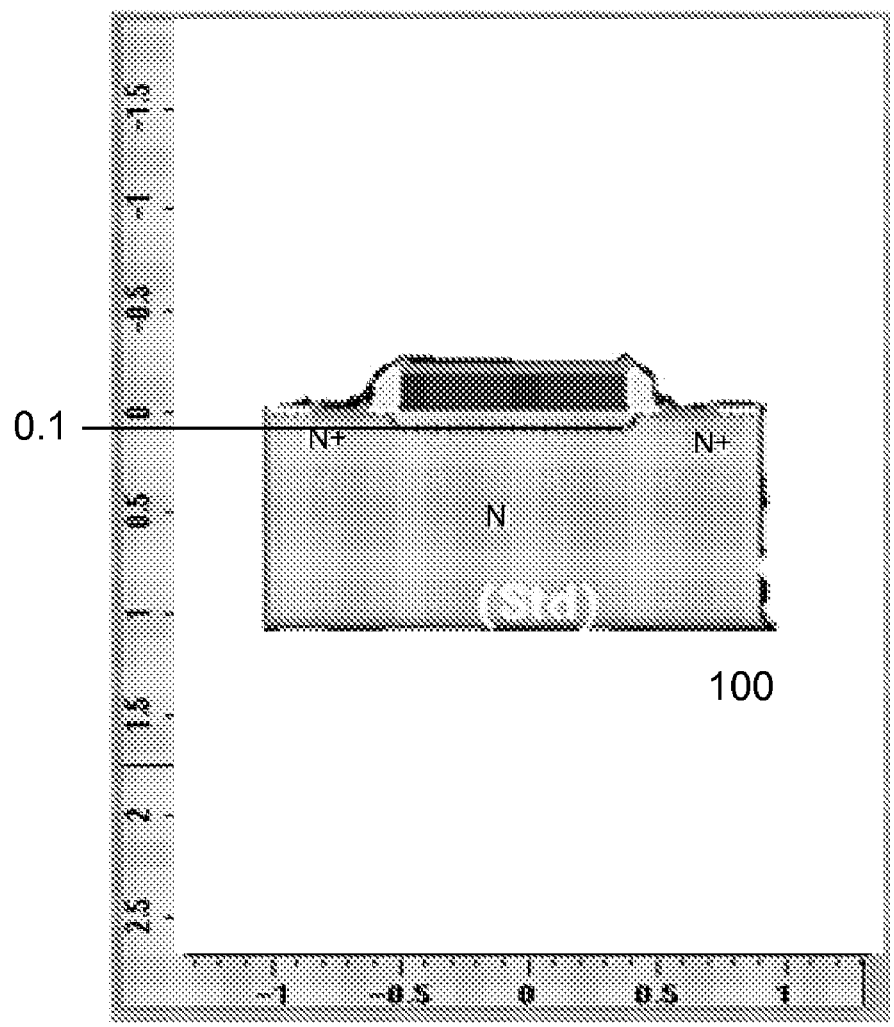
FIGS. 4a-b show 2-dimensional plots of a conventional MOS varactor and a MOS varactor in accordance with one embodiment of the invention, respectively.
Figure 4B:
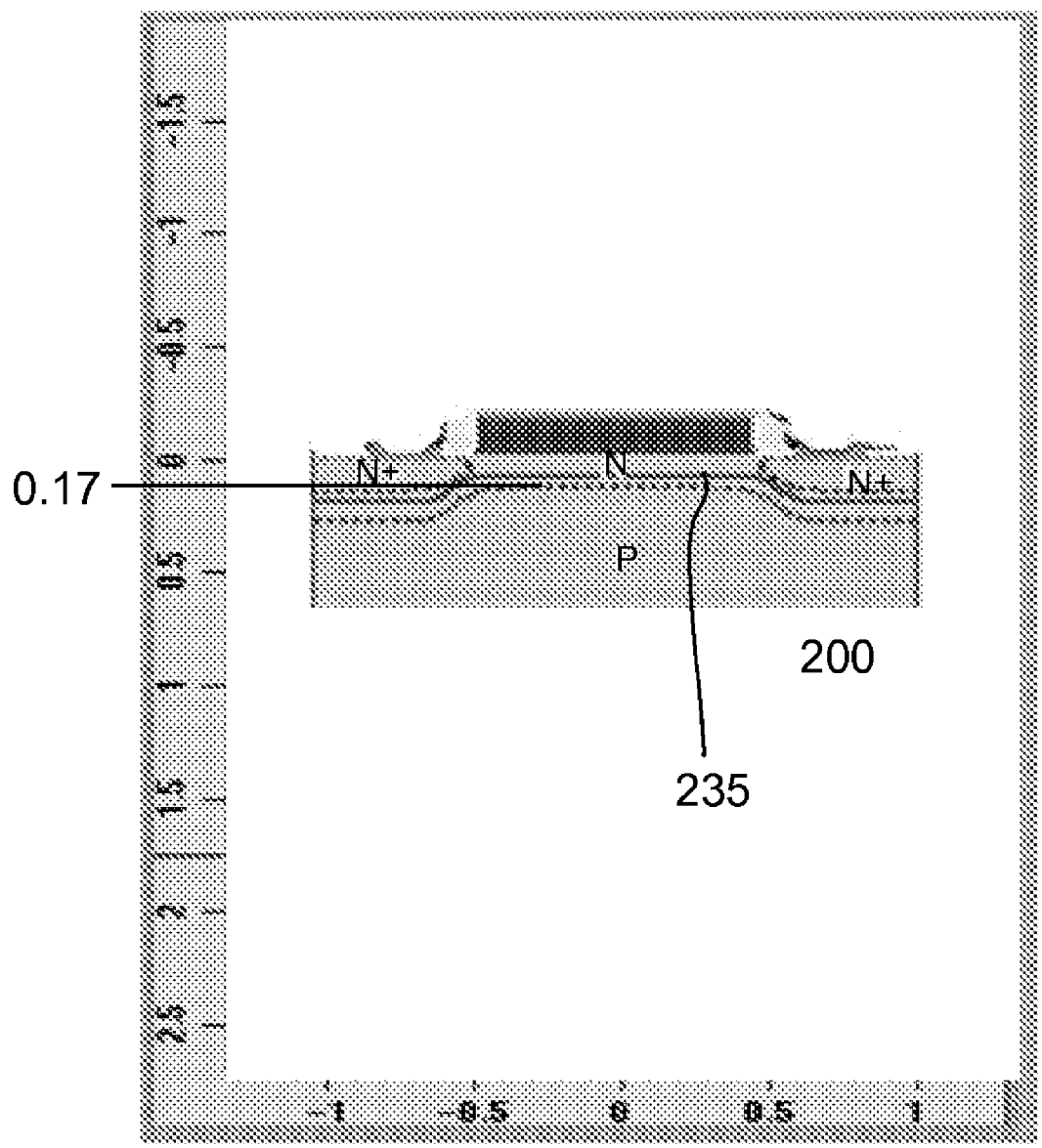

FIG. 4a shows a simulated 2-dimensional plot of a conventional n-type MOS varactor 100 and FIG. 4b shows a simulated 2-dimensional plot of an n-type MOS varactor 200 in accordance with one embodiment of the invention. The simulation applied an input voltage $V_{in}$ to the gate, equal to $-1.8$ V, causing the varactors to operate in depletion mode. As shown in FIG. 4a, the width of the depletion region of the conventional varactor is about 0.1. However, as shown in FIG. 4b, with a shallow PN junction 235, the width of the depletion region increases to about 0.17. The simulations clearly evidence that providing a shallow PN junction in accordance with the invention results in a wider depletion region when operating in the depletion mode. This corresponds to a smaller $C_{min}$, which results in a wider tuning range.

Simulations of various p-type and n-type MOS varactors were conducted. In particular, the simulations measured tuning range of a conventional varactor and varactors with a shallow PN junction with and without biasing of the buried well.

Figure 5:
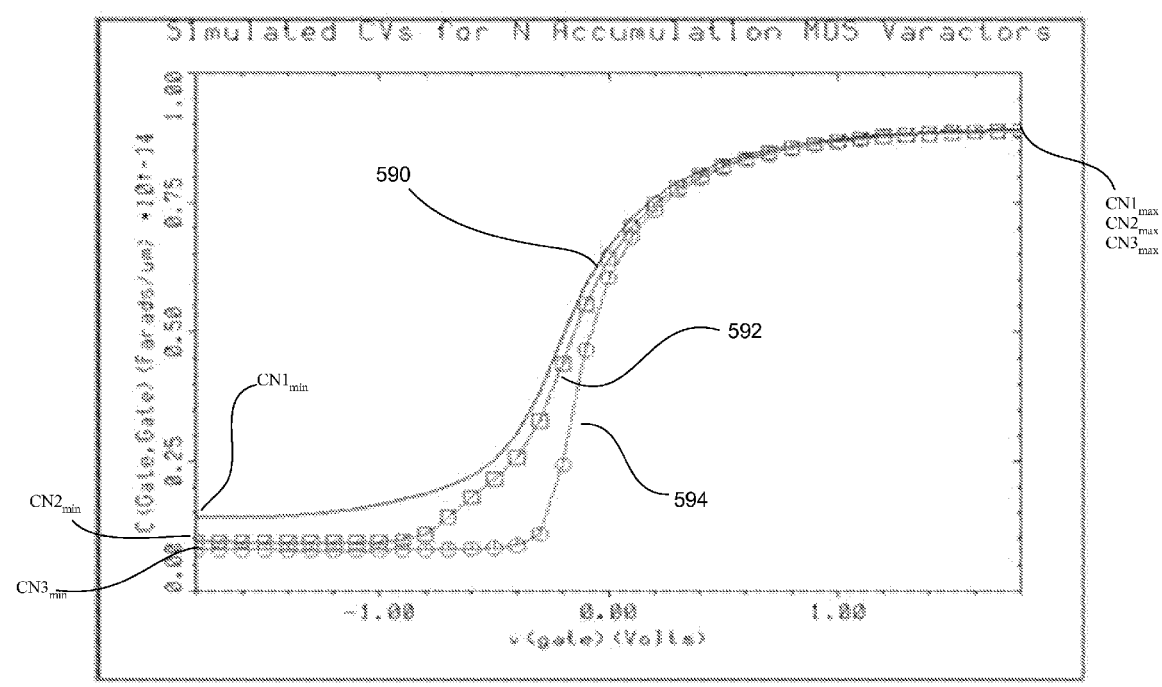
FIGS. 5-6 show simulated CV curves of various n-type accumulation MOS varactors and p-type accumulation MOS varactors, respectively.

FIG. 5 shows the simulated capacitance-voltage (CV) curves for the various n-MOS varactors with a 0.18 μm CMOS process. CV curve 590 corresponds to the conventional n-type MOS varactor (NV1). CV curve 592 corresponds to the n-type MOS varactor having a shallow PN junction without a bias to the buried well (NV2), while CV curve 594 corresponds to the n-type MOS varactor having a shallow PN junction with a reverse bias to the buried well (NV3). As shown in FIG. 5, the maximum capacitance of the NV1 ($CN1_{max}$), NV2 ($CN2_{max}$) and NV3 ($CN3_{max}$) are about the same at $0.87 \times 10^{-14}$ F/μm. The minimum capacitance for NV1 ($CN1_{min}$) is about $0.14 \times 10^{-14}$ F/μm, for NV2 ($CN2_{min}$) is about $0.09 \times 10^{-14}$ F/μm, and for NV3 ($CN3_{min}$) is about $0.077 \times 10^{-14}$ F/μm.

As shown in FIG. 5, n-MOS varactors having shallow PN junction produce a lower minimum capacitances, resulting in wider tuning ranges, as defined by $C_{max}/C_{min}$. Specifically, NV1 has a tuning range of 6.2, NV2 has a tuning range of 9.6 and NV3 has a tuning range of 11.35. This corresponds to an increase in tuning range of about 55% for NV2 and about 83% for NV3.

Figure 6:
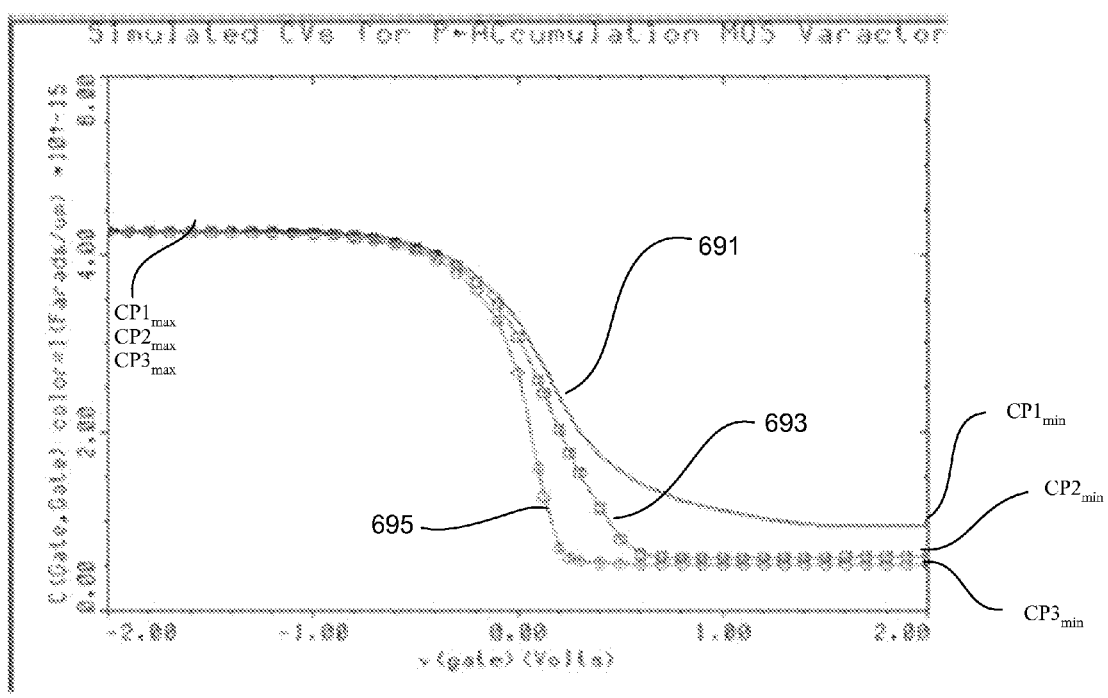

FIG. 6 shows the capacitance-voltage (CV) curve for the various simulated p-MOS varators. CV curve 691 corresponds to the conventional p-type MOS varactor (PV1). CV curve 693 corresponds to the p-type MOS varactor having a shallow PN junction without a bias to the buried well (PV2) while CV curve 695 corresponds to the p-type MOS varactor having a shallow PN junction with a reverse bias to the buried well (PV3). As shown in FIG. 6, the maximum capacitance of the PV1 ($CP1_{max}$), PV2 ($CP2_{max}$) and PV3 ($CP3_{max}$) are about the same at $4.25 \times 10^{-15}$ F/μm. The minimum capacitance for PV1 ($CP1_{min}$) is about $0.9 \times 10^{-15}$ F/μm, for PV2 ($CP2_{min}$) is about $0.6 \times 10^{-15}$ F/μm, and for PV3 ($CP3_{min}$) is about $0.51 \times 10^{-15}$ F/μm.

As shown in FIG. 6, p-MOS varactors having shallow PN junction produce a lower minimum capacitances, resulting in wider tuning range. Specifically, PV1 has a tuning range of 4.5, PV2 has a tuning range of 7.1 and PV3 has a tuning range of 8.3. This corresponds to an increase in tuning range of about 58% for PV2 and about 85% for PV3.

The simulations also determine the quality factor Q of the varactors which is defined by the following equation:

$$Q = 1/(2*\Pi*F*Ce*Re), \text{ where}$$

F is the RF signal frequency;
Ce is the effective gate to silicon capacitance; and
Re is the effective channel resistance.

Figure 7:
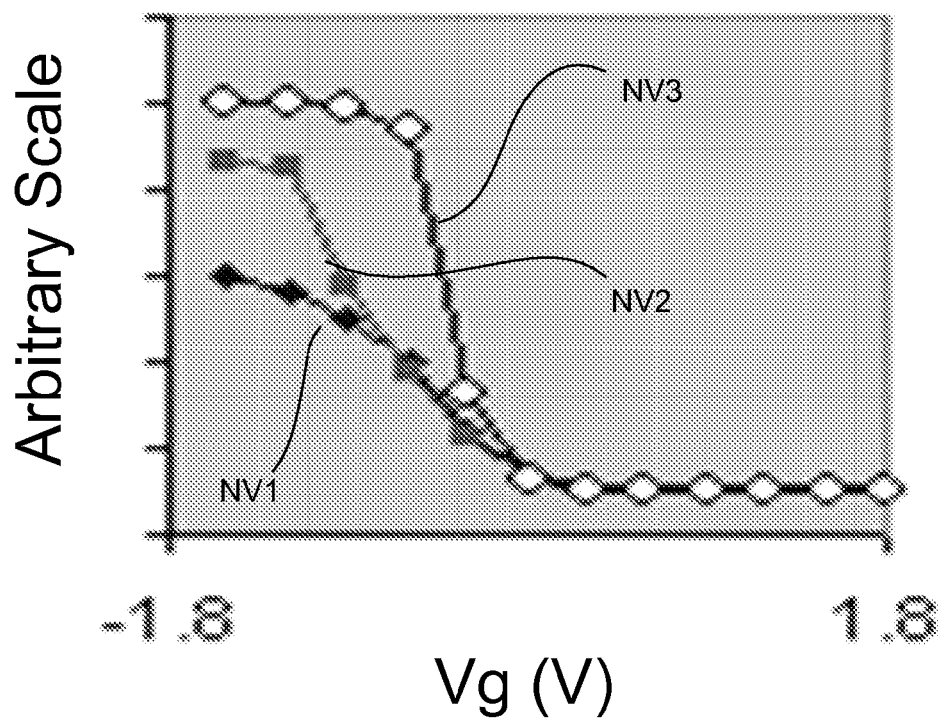
FIGS. 7-8 show simulated quality factor data measurements of various n-type accumulation MOS varactors and p-type accumulation MOS varactors, respectively.
Figure 8:
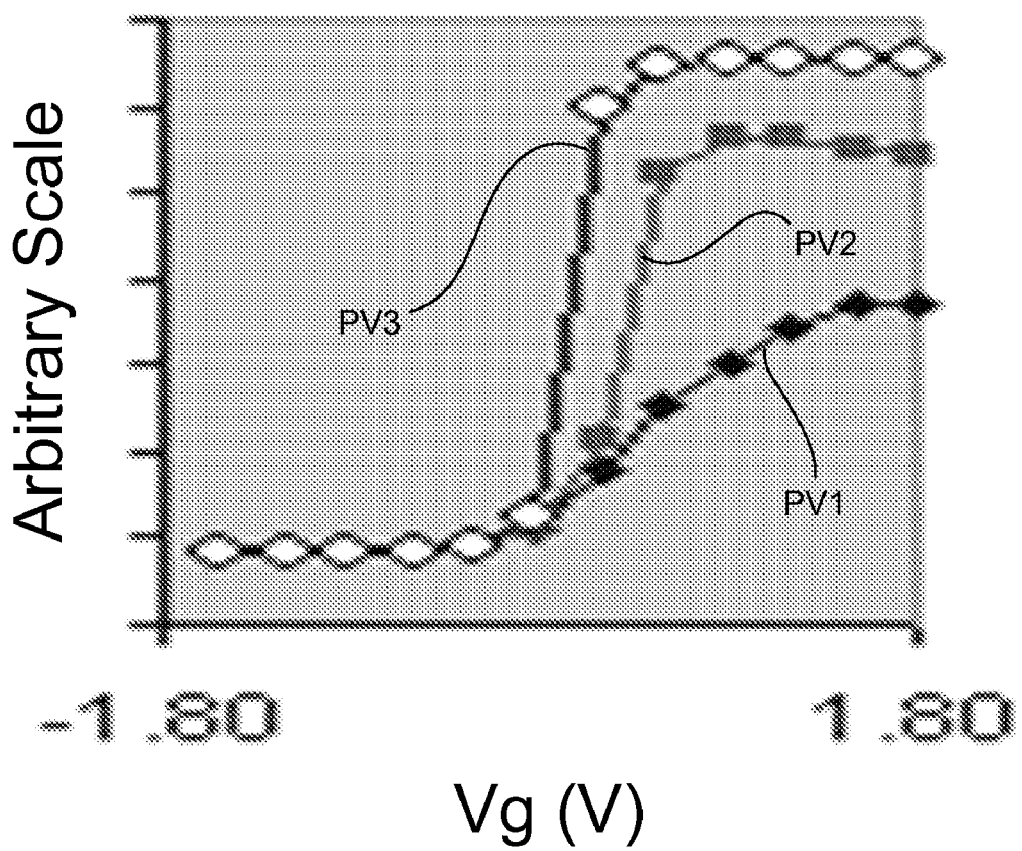

FIG. 7 plots the quality factors for NV1, NV2 and NV3 while FIG. 8 plots the quality factors for PV1, PV2 and PV3. As evidenced from FIGS. 7-8, varactors in accordance with the invention (NV2, NV3, PV2, and PV3) have higher Q values in the depletion mode than conventional varactors (NV1 and PV1) while the Q values are about the same in accumulation mode.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a varactor comprising:
providing a substrate prepared with a first well of a first polarity type, wherein the first well defines a varactor region, the first well comprising a lower first well boundary located above a bottom surface of the substrate;
forming a second well in the varactor region, the second well comprises a buried well of a second polarity type having an upper second well boundary disposed below an upper portion of the first well from an upper first well boundary to the upper second well boundary and a lower second well boundary disposed above the lower first well boundary, wherein an interface of the second well and the upper portion of the first well forms a shallow PN junction in the varactor region; and
forming a gate structure in the varactor region, the upper portion of the first well beneath the gate structure forms a channel region of the varactor, wherein in depletion mode, a depletion region under the gate structure in the channel region merges with a depletion region of the shallow PN junction.

2. The method of claim 1 wherein:
the first polarity type comprises n-type, the second polarity type comprises p-type, and the varactor comprises an n-MOS varactor; or
the first polarity type comprises p-type, the second polarity type comprises n-type, and the varactor comprises a p-type MOS varactor.

3. The method of claim 1 comprises forming contact regions that include heavily doped regions of the first polarity type in the substrate, wherein the contact regions are adjacent to first and second opposite sides of the gate structure.

4. The method of claim 3 wherein the contact regions are electrically coupled to the upper portion of the first well above the second well.

5. The method of claim 3 comprises coupling a bias terminal to the contact regions, the bias terminal is coupled to a bias voltage.

6. The method of claim 1 wherein the gate structure comprises a gate dielectric below a gate electrode.

7. The method of claim 6 comprises of forming sidewall spacers on first and second opposite sidewalls of the gate structure.

8. The method of claim 7 wherein:
the first polarity type comprises n-type, the second polarity type comprises p-type, and the varactor comprises an n-MOS varactor; or
the first polarity type comprises p-type, the second polarity type comprises n-type, and the varactor comprises a p-type MOS varactor.

9. The method of claim 6 comprises coupling an input terminal to the gate electrode, wherein the input terminal is coupled to an input voltage comprising a range from depletion to accumulation input voltages.

10. A method of forming an integrated circuit comprising:
providing a substrate prepared with a first well, the first well defining a varactor region, the first well comprises a first polarity type, the first well comprising a lower first well boundary located above a bottom surface of the substrate;
forming a second well in the varactor region, the second well comprises a buried well of a second polarity type having an upper second well boundary disposed below an upper portion of the first well from an upper first well boundary to the upper second well boundary and a lower second well boundary disposed above the lower first well boundary, wherein an interface of the second well and the upper portion of the first well forms a shallow PN junction in the varactor region; and
forming a gate structure in the varactor region, the upper portion of the first well beneath the gate structure forms a channel region of the varactor, wherein in depletion mode, a depletion region under the gate structure in the channel region merges with a depletion region of the shallow PN junction.

11. The method of claim 10 wherein:
the first polarity type comprises n-type, the second polarity type comprises p-type, and the varactor comprises an n-MOS varactor; or
the first polarity type comprises p-type, the second polarity type comprises n-type, and the varactor comprises a p-type MOS varactor.

12. The method of claim 10 wherein the gate structure comprises a gate dielectric below a gate electrode.

13. The method of claim 12 comprises of forming contact regions that includes heavily doped regions of the first polarity type in the substrate, wherein the contact regions are adjacent to first and second opposite sidewalls of the gate structure.

14. The method of claim 13 comprises coupling an input terminal to the gate electrode, wherein the input terminal is coupled to an input voltage comprising a range from depletion to accumulation input voltages.

15. The method of claim 12 comprises coupling an input terminal to the contact regions, wherein the input terminal is coupled to an input voltage comprising a range from depletion to accumulation input voltages.

16. The method of claim 10 comprises of forming contact regions that include heavily doped regions of the first polarity type in the substrate, wherein the contact regions are adjacent to first and second opposite sidewalls of the gate structure.

17. The method of claim 16 wherein the channel is electrically coupled to the contact regions.

18. A method of forming an integrated circuit comprising:
providing a substrate prepared with a first well, the first well defining a varactor region, the first well comprises a first polarity type, the first well comprising a lower first well boundary located above a bottom surface of the substrate;
forming a second well in the varactor region, the second well comprises a buried well of a second polarity type having an upper second well boundary disposed below an upper portion of the first well from an upper first well boundary to the upper second well boundary and a lower second well boundary disposed above the lower first well boundary, wherein an interface of the second well and the upper portion of the first well forms a shallow PN junction in the varactor region; and
forming a gate structure and contact regions in the varactor region, the contact regions are adjacent to first and second opposite sidewalls of the gate structure, the upper portion of the first well beneath the gate structure forms a channel region of the varactor, wherein in depletion mode, a depletion region under the gate structure in the channel region merges with a depletion region of the shallow PN junction.

19. The method of claim 18 wherein forming the second well comprises implanting ions of the second polarity type into the varactor region.

20. The method of claim 18 wherein the contact regions include heavily doped regions of the first polarity type in the substrate.

21. The method of claim 20 wherein the channel is electrically coupled to the contact regions.

* * * * *